US009818938B2

(12) United States Patent
Tu et al.

(10) Patent No.: US 9,818,938 B2
(45) Date of Patent: Nov. 14, 2017

(54) METHOD OF FORMING A SEMICONDUCTOR STRUCTURE

(71) Applicant: TAIWAN SEMICONDUCTOR MANUFACTURING COMPANY, LTD., Hsinchu (TW)

(72) Inventors: Kuo-Chi Tu, Hsinchu (TW); Chih-Yang Chang, Yuanlin Township (TW); Hsia-Wei Chen, Taipei (TW); Yu-Wen Liao, New Taipei (TW); Chin-Chieh Yang, New Taipei (TW); Wen-Ting Chu, Kaohsiung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 14/844,207

(22) Filed: Sep. 3, 2015

(65) Prior Publication Data
US 2015/0380644 A1 Dec. 31, 2015

Related U.S. Application Data

(63) Continuation of application No. 13/722,466, filed on Dec. 20, 2012, now Pat. No. 9,130,162.

(51) Int. Cl.
*H01L 45/00* (2006.01)
*H01L 27/24* (2006.01)

(52) U.S. Cl.
CPC ...... *H01L 45/1253* (2013.01); *H01L 27/2436* (2013.01); *H01L 27/2463* (2013.01);
(Continued)

(58) Field of Classification Search
CPC ............... H01L 45/146; H01L 45/1675; H01L 45/1253; H01L 45/144; H01L 45/1616; H01L 45/1608
See application file for complete search history.

(56) References Cited

U.S. PATENT DOCUMENTS 6,849,891 B1  2/2005  Hsu et al.
6,867,064 B2  3/2005  Campbell et al.
(Continued)

FOREIGN PATENT DOCUMENTS

| TW | 201214434 | 4/2012 |
|---|---|---|
| TW | 201230305 | 7/2012 |
| TW | 201234460 | 8/2012 |

OTHER PUBLICATIONS

Wong, H.-S. Philip, et al., "Metal-Oxide RRAM", vol. 100, No. 6, Jun. 2012, Proceedings of the IEEE, pp. 1951-1970.
(Continued)

*Primary Examiner* — Marc Armand
*Assistant Examiner* — Quinton Brasfield
(74) *Attorney, Agent, or Firm* — Haynes and Boone, LLP

(57) ABSTRACT

A method of forming a semiconductor structure includes depositing a first electrode material over a conductive structure and a dielectric layer, patterning the first electrode material to form a first electrode contacting the conductive structure, depositing a resistance variable layer over the first electrode and the dielectric layer, depositing a second electrode material over the resistance variable layer, and etching a portion of the second electrode material and the resistance variable layer to form a second electrode over a remaining portion of the resistance variable layer.

20 Claims, 7 Drawing Sheets

(52) U.S. Cl.
CPC ............ *H01L 45/08* (2013.01); *H01L 45/124* (2013.01); *H01L 45/1233* (2013.01); *H01L 45/14* (2013.01); *H01L 45/146* (2013.01); *H01L 45/1608* (2013.01); *H01L 45/1675* (2013.01)

(56) References Cited

U.S. PATENT DOCUMENTS

| | | | |
|---|---|---|---|
| 7,169,637 B2 | 1/2007 | Zhang et al. | |
| 7,407,858 B2 | 8/2008 | Li et al. | |
| 7,697,318 B2 | 4/2010 | Fukuda et al. | |
| 7,709,885 B2 | 5/2010 | Daley et al. | |
| 7,795,606 B2 | 9/2010 | Jin et al. | |
| 8,000,128 B2 * | 8/2011 | Li | G11C 13/0007 365/148 |
| 8,009,454 B2 | 8/2011 | Lee et al. | |
| 2004/0262665 A1 | 12/2004 | Iwata et al. | |
| 2005/0110983 A1 * | 5/2005 | Jeong | H01L 45/1666 356/148 |
| 2008/0089104 A1 | 4/2008 | Tanaka et al. | |
| 2010/0001253 A1 * | 1/2010 | Arnold | H01L 45/06 257/4 |
| 2010/0110758 A1 | 5/2010 | Li et al. | |
| 2010/0230655 A1 | 9/2010 | Noshiro | |
| 2010/0237317 A1 * | 9/2010 | Tsunoda | G11C 13/0007 257/4 |
| 2010/0320436 A1 | 12/2010 | Liu | |
| 2011/0220862 A1 | 9/2011 | Arita et al. | |
| 2011/0281414 A1 | 11/2011 | Marsh et al. | |
| 2011/0291064 A1 * | 12/2011 | Marsh | H01L 27/101 257/4 |
| 2013/0040408 A1 | 2/2013 | Nam et al. | |
| 2013/0221308 A1 | 8/2013 | Toh et al. | |

OTHER PUBLICATIONS

Chien, W. C., et al., "Multi-Layer Sidewall WOx Resistive Memory Suitable for 3D ReRAM", 2012 Symposium on VLSI Technology Digest of Technical Papers, pp. 153-154.

Office Action dated Jun. 11, 2015 from corresponding application No. TW 102145070.

\* cited by examiner

US 9,818,938 B2

METHOD OF FORMING A SEMICONDUCTOR STRUCTURE

PRIORITY CLAIM

The present application is a continuation of U.S. application Ser. No. 13/722,466, filed Dec. 20, 2012, which is incorporated herein by reference in its entirety.

TECHNICAL FIELD

This disclosure relates generally to a semiconductor structure and, more particularly, to a resistance variable memory structure and method of forming a resistance variable memory structure.

BACKGROUND

In integrated circuit (IC) devices, resistive random access memory (RRAM) is an emerging technology for next generation non-volatile memory devices. RRAM is a memory structure including an array of RRAM cells each stores a bit of data using resistance, rather than electronic charge. Particularly, each RRAM cell includes a resistance variable layer, the resistance of which can be adjusted to represent logic "0" or logic "1".

From an application point of view, RRAM has many advantages. RRAM has a simple cell structure and CMOS logic comparable processes which result in a reduction of the manufacturing complexity and cost in comparison with other non-volatile memory structures. Despite the attractive properties noted above, a number of challenges exist in connection with developing RRAM. Various techniques directed at configurations and materials of these RRAMs have been implemented to try and further improve device performance.

BRIEF DESCRIPTION OF THE DRAWINGS

Aspects of the present disclosure may be understood from the following detailed description and the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure.

According to one or more embodiments of this disclosure, a semiconductor structure includes a resistance variable memory structure. The resistance variable memory structure includes a resistance variable layer formed between two electrodes. By applying a specific voltage to each of the two electrodes, an electric resistance of the resistance variable layer is altered. The low and high resistances are utilized to indicate a digital signal "1" or "0", thereby allowing for data storage. The switching behavior depends not only on the materials of the resistance variable layer but also on the choice of electrodes and interfacial properties of the electrodes.

According to one or more embodiments of this disclosure, the semiconductor structure having a resistance variable memory structure is formed within a chip region of a substrate. A plurality of semiconductor chip regions is marked on the substrate by scribe lines between the chip regions. The substrate will go through a variety of cleaning, layering, patterning, etching and doping steps to form the semiconductor structures. The term "substrate" herein generally refers to a bulk substrate on which various layers and device structures are formed. In some embodiments, the bulk substrate includes silicon or a compound semiconductor, such as GaAs, InP, Si/Ge, or SiC. Examples of the layers include dielectric layers, doped layers, polysilicon layers or conductive layers. Examples of the device structures include transistors, resistors, and/or capacitors, which may be interconnected through an interconnect layer to additional integrated circuits.

Figure 1:
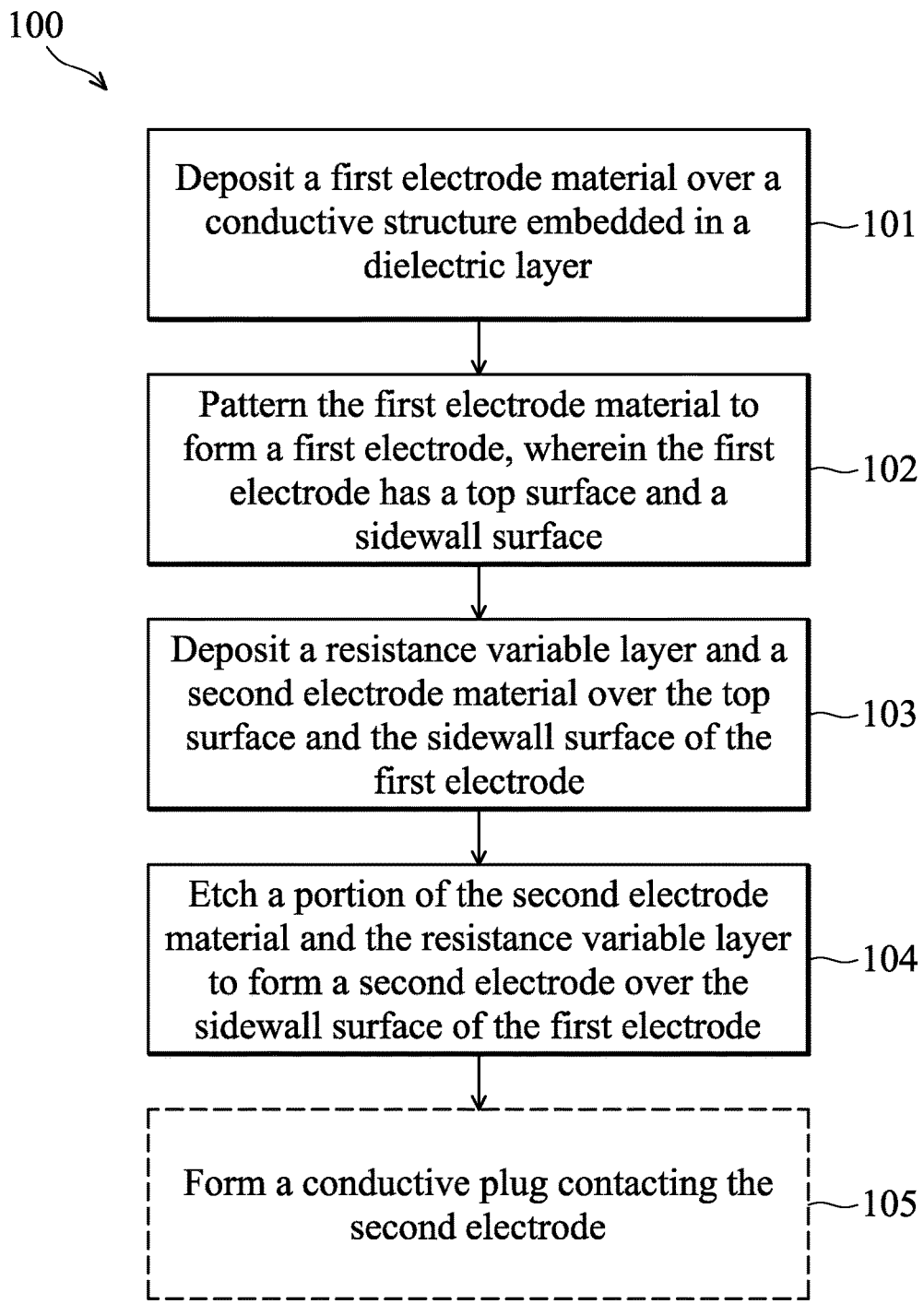
FIG. 1 is a flowchart of a method of forming a semiconductor structure having a resistance variable memory structure according to at least one embodiment of this disclosure.

FIG. 1 is a flowchart of a method 100 of forming a semiconductor structure having a resistance variable memory structure according to at least one embodiment of this disclosure. FIGS. 2A to 2F are cross-sectional views of a semiconductor structure 200 having a resistance variable memory structure at various stages of manufacture according to various embodiments of the method 100 of FIG. 1. Additional processes may be performed before, during, or after the method 100 of FIG. 1. Various figures have been simplified for a better understanding of the inventive concepts of the present disclosure.

Referring now to FIG. 1, the flowchart of the method 100 begins with operation 101. In at least one embodiment, a dielectric layer is formed over a substrate. At least one conductive structure is formed over the substrate and embedded in the dielectric layer. The at least one conductive structure has a portion exposed to a top surface of the dielectric layer. A first electrode material is deposited over the conductive structure and the dielectric layer.

Figure 2A:
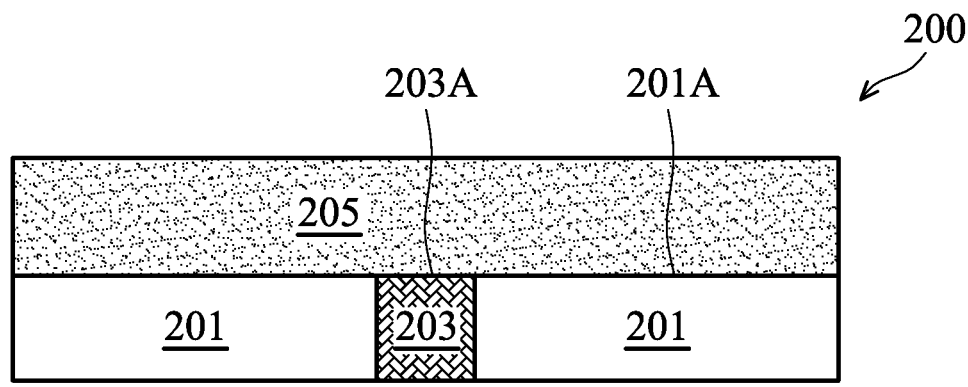
FIGS. 2A to 2F are cross-sectional views of semiconductor structures having a resistance variable memory structure at various stages of manufacture according to one or more embodiments of the method of FIG. 1.

Referring to FIG. 2A, which is a cross-sectional view of a portion of a semiconductor structure 200 having a resistance variable memory structure after performing operation 101. The semiconductor structure 200 includes a substrate (not shown). In the illustrated examples of FIGS. 2A-2F, the semiconductor structures 200 include a dielectric layer 201 formed on a top surface of the substrate (not shown). In at least one embodiment, the dielectric layer 201 includes one or more dielectric layers. The dielectric layer 201 comprises silicon oxide, fluorinated silica glass (FSG), carbon doped silicon oxide, silicon nitride, silicon oxynitride, tetra-ethylortho-silicate (TEOS) oxide, phosphosilicate glass (PSG), borophosphosilicate glass (BPSG), BLACK DIAMOND® (Applied Materials of Santa Clara, Calif.), amorphous fluorinated carbon, low dielectric constant (low-k) dielectric material, or combinations thereof. The deposition process may include chemical vapor deposition (CVD), atomic layer deposition (ALD), high density plasma CVD (HDPCVD) or spinning on glass.

A conductive structure 203 is formed embedded in the dielectric layer 201. In certain embodiments, the conductive structure 203 includes a conductive interconnect, a doped region or a silicide region. In some embodiments, the conductive structure 203 includes aluminum, aluminum alloy, copper, copper alloy, titanium, titanium nitride, tantalum, tantalum nitride, tungsten, metal silicide, silicon or combinations thereof. In the illustrated example of FIG. 2A, the semiconductor structure 200 may be formed by lithography patterning and etching in the dielectric layer 201. A metal layer of the conductive structure 203 is deposited over the patterned dielectric layer 201 and subsequently planarized to form the conductive structure 203. A top surface 203A of the conductive structure 203 is substantially coplanar with a top surface 201A the dielectric layer 201.

A first electrode material 205 is deposited over top surfaces (203A and 201A) of the conductive structure 203 and the dielectric layer 201. The first electrode material 205 includes a conductive material having a proper work function such that a high work function wall is built between the first electrode material 205 and a resistance variable layer subsequently formed. The first electrode material 205 may comprise Pt, AlCu, TiN, Au, Ti, Ta, TaN, TaN, W, WN, Cu or combinations thereof. Possible formation methods include electroless plating, sputtering, electro plating, PVD or ALD. In some embodiments, the first electrode material 205 is electrically connected to an underlying electrical component, such as a transistor, through the conductive structure 203.

Referring back to FIG. 1, method 100 continues with operation 102. In operation 102, the first electrode material is patterned to form a first electrode. The first electrode has a top surface and a sidewall.

Figure 2B:
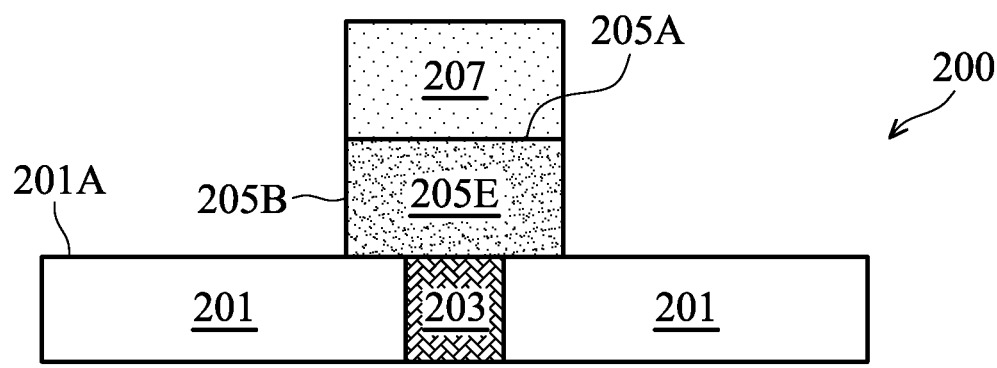

Referring to FIG. 2B, which is a cross-sectional view of a portion of the semiconductor structure 200 after performing operation 102. A mask layer 207 having a feature is formed over the first electrode material 205 and also over the conductive structure 203. The feature is formed by a suitable process, including deposition, lithography patterning, and/or etching processes. An etching process is performed to remove the first electrode material 205 not underlying the feature of the mask layer 207. Then, a first electrode 205E is formed and contacts the conductive structure 203.

The mask layer 207 is removed after the etching process from the semiconductor structure 200 and a top surface 205A of the first electrode 205E is exposed. Also, the first electrode 205E has a sidewall surface 205B connected to the top surface 205A. The removing process of the mask layer 207 may include a dry etching process, wet etching process, or combination thereof Referring back to FIG. 1, method 100 continues with operation 103. In operation 103, a resistance variable layer and a second electrode material are deposited over the top surface and the sidewall surface of the first electrode.

Figure 2C:
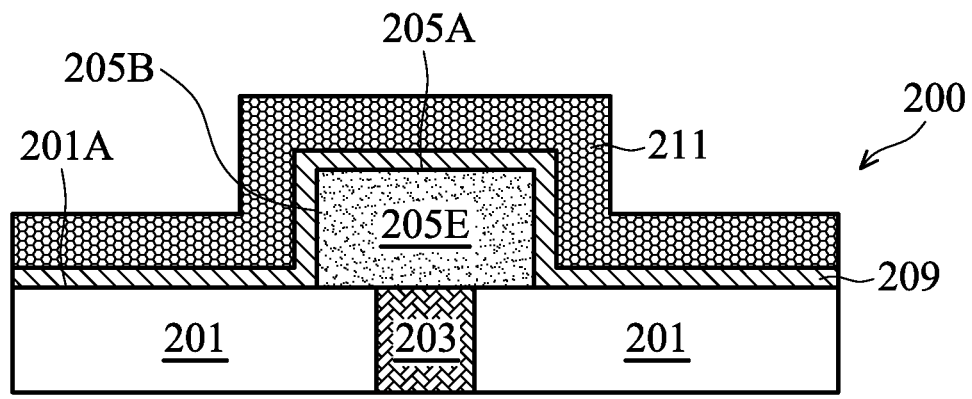

FIG. 2C is a cross-sectional view of the semiconductor structure 200 after performing operation 103. A resistance variable layer 209 is deposited over the top surface 205A and the sidewall surface 205B of the first electrode 205E, and the top surface 201A of the dielectric layer 201. The resistance variable layer 209 has a resistivity (or conductivity) capable of switching between a high resistance state and a low resistance state, by application of an electrical voltage. In various embodiments, the resistance variable layer 209 includes at least one of dielectric materials comprising a high dielectric constant (high-k) dielectric material, a binary metal oxide or a transition metal oxide. In some embodiments, the resistance variable layer 209 includes nickel oxide, titanium oxide, hafnium oxide, zirconium oxide, zinc oxide, tungsten oxide, aluminum oxide, tantalum oxide, molybdenum oxide or copper oxide. Possible formation methods include pulse laser deposition (PLD) or ALD, such as ALD with a precursor containing zirconium and oxygen. In one example, the resistance variable layer 209 has a thickness in a range from about 10 angstrom to about 500 angstrom.

A second electrode material 211 is deposited over the resistance variable layer 209. The second electrode material 211 may include suitable conductive material to electrically connect a subsequently formed resistance variable memory structure to other portions of an interconnect structure for electrical routing. The second electrode material 211 may comprise Pt, AlCu, TiN, Au, Ti, Ta, TaN, TaN, W, WN, Cu or combinations thereof. In at least one example, the second electrode material 211 has a thickness in a range from about 30 angstrom to about 3000 angstrom. In some embodiments, the first electrode material 205 and the second electrode material 211 have a same composition. In some embodiments, the first electrode material 205 and the second electrode material 211 have different compositions. Possible formation methods include electroless plating, sputtering, electro plating, PVD or ALD.

Referring back to FIG. 1, the method 100 continues with operation 104 in which a portion of the second electrode material and the resistance variable layer are etched to form a second electrode over a sidewall of the first electrode.

Figure 2D:
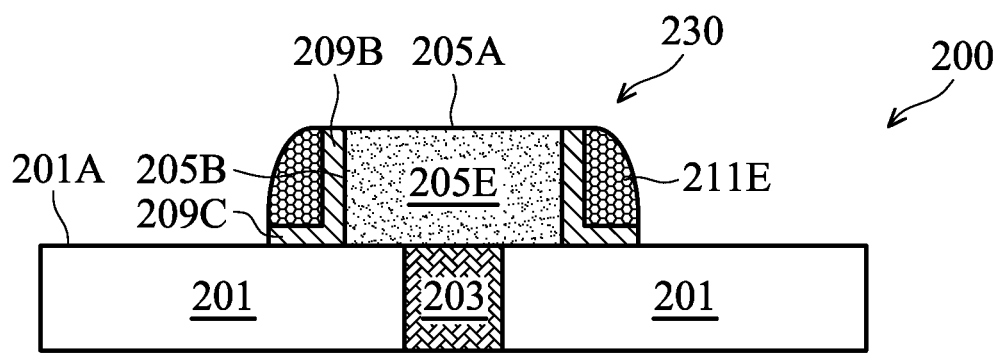

FIG. 2D is a cross-sectional view of the semiconductor structure 200 after performing operation 104. In at least one embodiment, a portion of the second electrode material 211 and the resistance variable layer 209 are anisotropically etched to form a spacer over the sidewall 205B of the first electrode 205E without lithography patterning process. The spacer includes a vertical portion 209A of a remaining resistance variable layer 209 over sidewall 205B of the first electrode 205E and a horizontal portion 209C of the remaining resistance variable layer 209 over the top surface 201A of the dielectric layer 201. The spacer further includes a second electrode 211E formed over the vertical portion 209B and the horizontal portion 209C of the remained resistance variable layer 209. A resistance variable memory structure 230 including the first electrode 205E, the vertical portion 209B and the horizontal portion 209C of the resistance variable layer 209, and the second electrode 211E is formed.

Figure 2E:
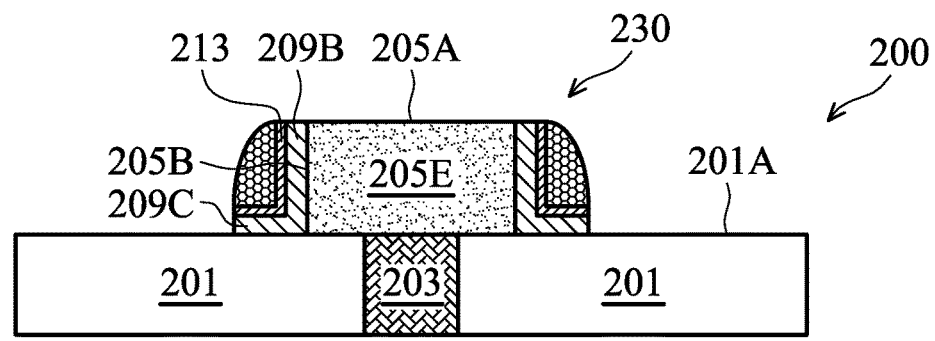

In some examples, the semiconductor structure 200 further includes a cap layer 213 optionally formed between the remaining resistance variable layer 209 and the second electrode 211E, such as over the vertical portion 209B and the horizontal portion 209C of the resistance variable layer 209 and underlying the second electrode 211E as shown in FIG. 2E. In some embodiments, the cap layer 213 includes a conductive material that is capable of depriving oxygen from the resistance variable layer 209 and thus causing vacancy defects formed in the resistance variable layer 209. The cap layer 213 comprises titanium, tantalum or hafnium in some embodiments.

Referring back to FIG. 1, the method 100 optionally continues with operation 105 in which a conductive plug is formed contacting the second electrode.

Figure 2F:
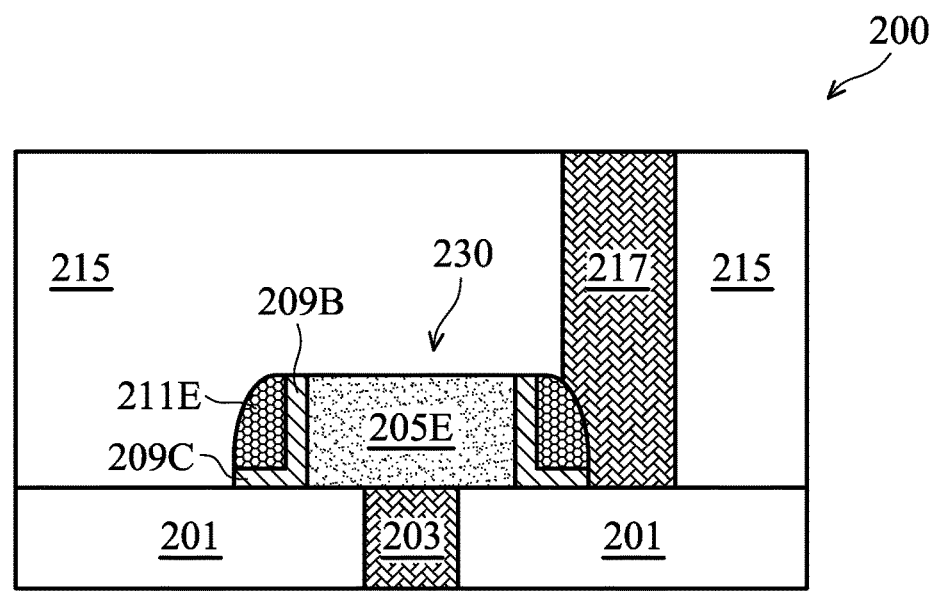

FIG. 2F is a cross-sectional view of the semiconductor structure 200 after performing operation 105. An inter-level dielectric (ILD) layer 215 may be blanket formed over the resistance variable memory structure 230. A chemical mechanical polishing (CMP) process is further applied to the semiconductor structure 200 to planarize the ILD layer 215. The ILD layer 215 may include multiple dielectric layers. The ILD layer 215 may comprise silicon oxide, fluorinated silica glass (FSG), carbon doped silicon oxide, silicon nitride, silicon oxynitride, TEOS oxide, phosphosilicate glass (PSG), borophosphosilicate glass (BPSG), amorphous fluorinated carbon, low-k dielectric material, or combinations thereof.

An opening is formed in the ILD layer 215 to expose a portion of the second electrode 211E. A conductive material of a contact plug 217 may overfill the opening in the ILD layer 215. The conductive material may include copper, copper alloys, aluminum or tungsten. The possible formation methods include electroless plating, sputtering, electro plating or chemical vapor deposition (CVD). The excess conductive material outside of the opening is removed through a suitable process such as chemical mechanical polishing (CMP). The contact plug 217 having the conductive material is formed contacting the second electrode 211E of the resistance variable memory structure 230.

Figure 2G:
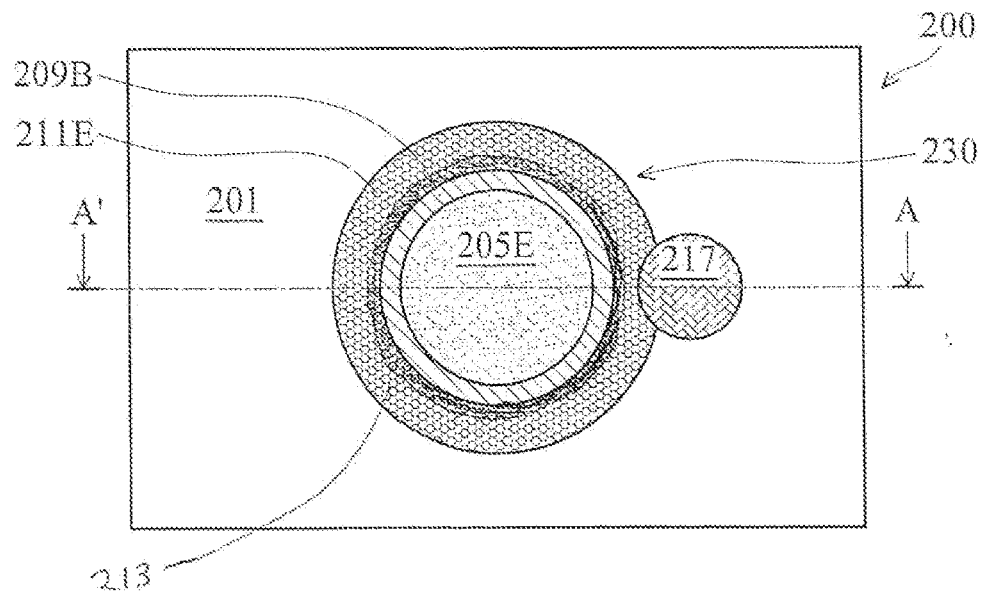
FIG. 2G is a planar view of the semiconductor structure having the resistance variable memory structure of FIG. 2F.

FIG. 2G is a planar view of the semiconductor structure 200. FIG. 2F is the cross-sectional view obtained from a vertical plane crossing line A-A' in FIG. 2G. In FIG. 2G, the first electrode 205E is surrounded by the vertical portion 209B of the resistance variable layer 209. The vertical portion 209B of the resistance variable layer 209 is surrounded by the second electrode 211E. The vertical portion 209B of the resistance variable layer 209 and the second electrode 211E are closed loops surrounding the first electrode 205E. When the semiconductor structure 200 is cut through crossing line A-A' in FIG. 2G, the second electrode 211E is illustrated as two portions on opposite sides of the first electrode 205E in FIG. 2F. The conductive structure 203 in FIG. 2F and the horizontal portion 209C of the resistance variable layer 209 in FIG. 2F are underlying the first electrode 205E and the second electrode 211E, respectively. Hence, the conductive structure 203 and the horizontal portion 209C in FIG. 2F are not shown in FIG. 2G.

Figure 2H:
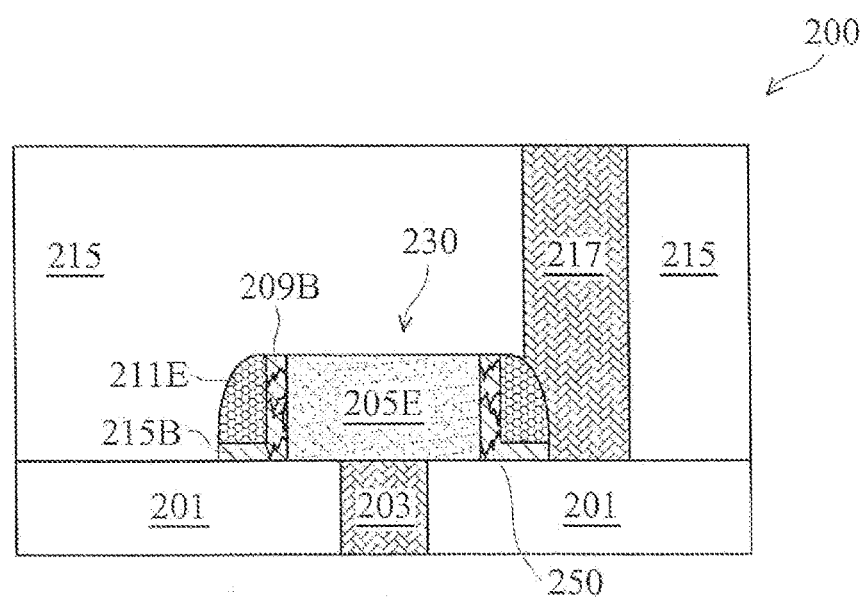
FIG. 2H is a cross-sectional view taken along line A-A' in FIG. 2G to show the semiconductor structure in operation with filaments formed in the resistance variable layer according to one or more embodiments of this disclosure.

FIG. 2H is a cross-sectional view of the semiconductor structure 200 having a resistance variable memory structure in various operations for data storage.

In a "forming" operation, a "forming" voltage is applied to the first and second electrodes 205E and 211E of the resistance variable memory structure 230. The "forming" voltage is high enough to generate a conductive portion in the vertical portion 209B of the resistance variable layer 209. In one example, the conductive portion includes one or more conductive filaments 250 to provide a conductive path such that the vertical portion 209B of the resistance variable layer 209 shows an "on" or low resistance state. The conductive path may be related to the lineup of the defect (e.g. oxygen) vacancies in the vertical portion 209B of the resistance variable layer 209. In some embodiments, the "forming" voltage is applied only one time. Once the conductive path is formed, the conductive path will remain present in the resistance variable layer 209B. Other operations may disconnect or reconnect the conductive path using smaller voltages or different voltages.

In a "reset" operation, a "reset" voltage high enough to break the conductive path in the resistance variable layer 209B is applied to the resistance variable memory structure 230 such that the resistance variable layer 209B shows an "off" or high resistance state.

Figure 3:
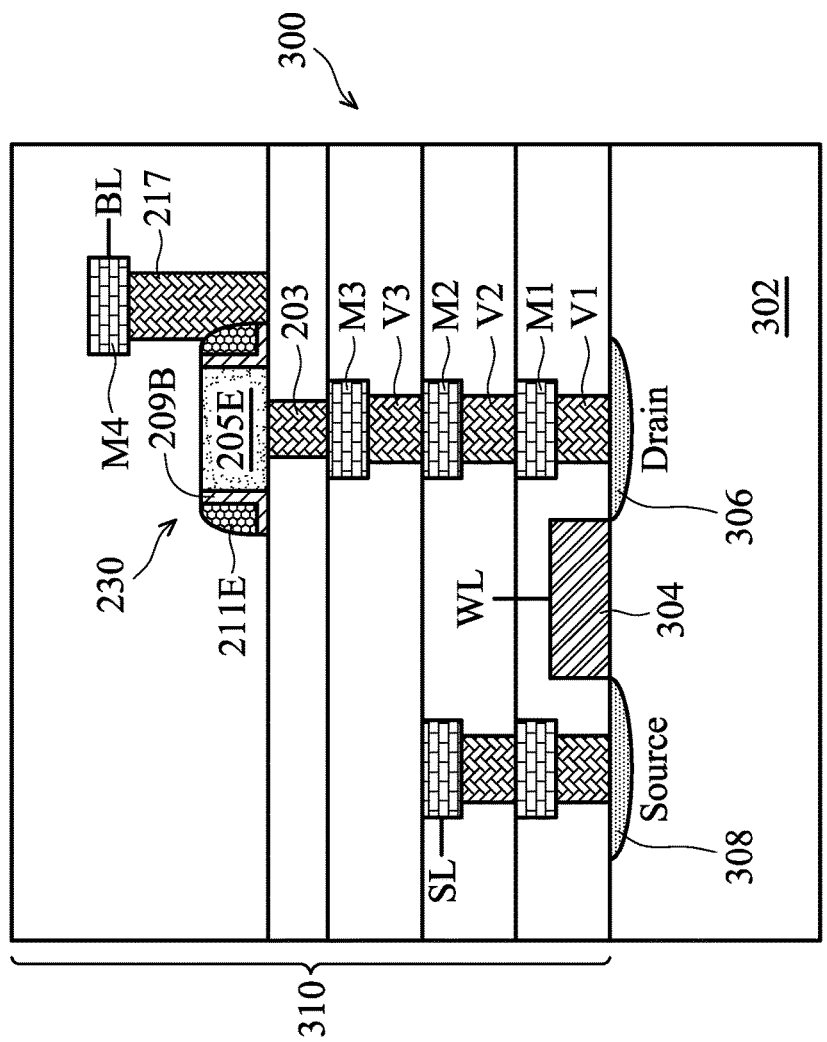
FIG. 3 is a cross-sectional view of a semiconductor structure having the resistance variable memory structure in FIG. 2D (or 2E) according to at least one embodiment of this disclosure.

In a "set" operation, a "set" voltage high enough to reconnect the conductive path in the resistance variable layer 209B is applied to the resistance variable memory structure 230 such that the resistance variable layer 209B shows the "on" or low resistance state. The "set" operation turns the resistance variable layer 209B to the low resistance state. By applying a specific voltage between two electrodes 205E and 211E, an electric resistance of the resistance variable layer 209B is altered after applying the specific voltage. The low and high resistances are utilized to indicate a digital signal "1" or "0", thereby allowing for data storage. FIG. 3 shows a cross-sectional view of a semiconductor structure 300 with the resistance variable memory structure 230 of FIG. 2D (or 2E) according to at least one embodiment of the present disclosure. The semiconductor structure 300 may be formed on a substrate 302 such as silicon, germanium, and/or a compound semiconductor material. The semiconductor structure 300 may include an access transistor that includes as a gate electrode 304, a drain region 306 and a source region 308 on opposite sides of the gate electrode 304. The gate electrode 304 is formed on a top surface of the substrate 302. The source region 308 and the drain region 306 are formed by implantation in a portion of the substrate 302. Multiple dielectric layers 310 are formed over the access transistor and the substrate 302. Details of the materials and fabrication methods of the multiple dielectric layers 310 can be found in the text associated with the dielectric layer 201 in the semiconductor structure 200 and are not repeated here.

Referring still to FIG. 3, a plurality of stacked metallization layers and via layers are formed over the access transistor and embedded in the dielectric layers 310. In at least one embodiment, the plurality of metallization layers includes four metal layers M1 to M4. Vertical columnar vias (V1 to V3, 203 and 217) interconnect the source region 232 and the drain region 231 to metallization layer M1, and connect different metallization layers M1, M2, M3, and M4. The plurality of stacked metal features and via layers provides interconnections between devices structures, circuits and/or inputs/outputs. The metallization layers and via layers may include aluminum, aluminum alloy, copper, copper alloy, titanium, titanium nitride, tantalum, tantalum nitride, tungsten, metal silicide, or combinations thereof.

In some embodiments, there are at least three metallization layers overlying the access transistor and underlying the resistance variable memory structure 230. In this illustrated example, the resistance variable memory structure 230 is formed between metallization layers M3 and M4. Vertical columnar vias 203 and 214 electrically connect the resistance variable memory structure 230 to the metallization layers M3 and M4, respectively. The source region 308 of the access transistor is coupled to a source line SL in metallization layer M2 through columnar via V1, metallization layer M1 and columnar via V2. A word line WL is electrically coupled to the gate electrode 304 to provide a gate voltage to turn on the access transistor. The drain region 306 may be coupled to the first electrode 205E of the resistance variable memory structure 230 through columnar vias (V1 to V3 and 203) and metallization layers (M1 to M). A bit line BL in metallization layer M4 is electrically coupled to the second electrode 211E of the resistance variable memory structure 230 through the columnar via 217.

Generally, some of the processes for forming the bottom metallization layers (M1 to M3) may have a process temperature higher than 400° C., such as the processes for annealing or dielectric layer formation. The stability of a resistance variable memory structure 230 may be affected by the high temperature processes if the resistance variable memory structure 230 is formed before the high temperature processes. In this embodiment, the resistance variable memory structure 230 is formed over the bottom metallization layers (M1 to M3). This disclosure eliminates the drawbacks of high temperature effect on the resistance variable memory structure 230 in bottom metallization layers (M1 to M3). Furthermore, there are several control lines (such as the source line, the word line and the bit line) used to control the operation of the resistance variable memory structure 230 and the access transistor. There are many spaces needed in bottom metallization layers for circuit routing to arrange these control lines. Advantageously, the resistance variable memory structure 230 is formed over the bottom metallization layers (M1 to M3). In this illustrated example, the resistance variable memory structure 230 is formed between upper metallization layers M3 and M4. In accordance with one or more embodiments of the present disclosure, there are more spaces for circuit routing by forming the resistance variable memory structure 230 in the upper metallization layers.

Figure 4:
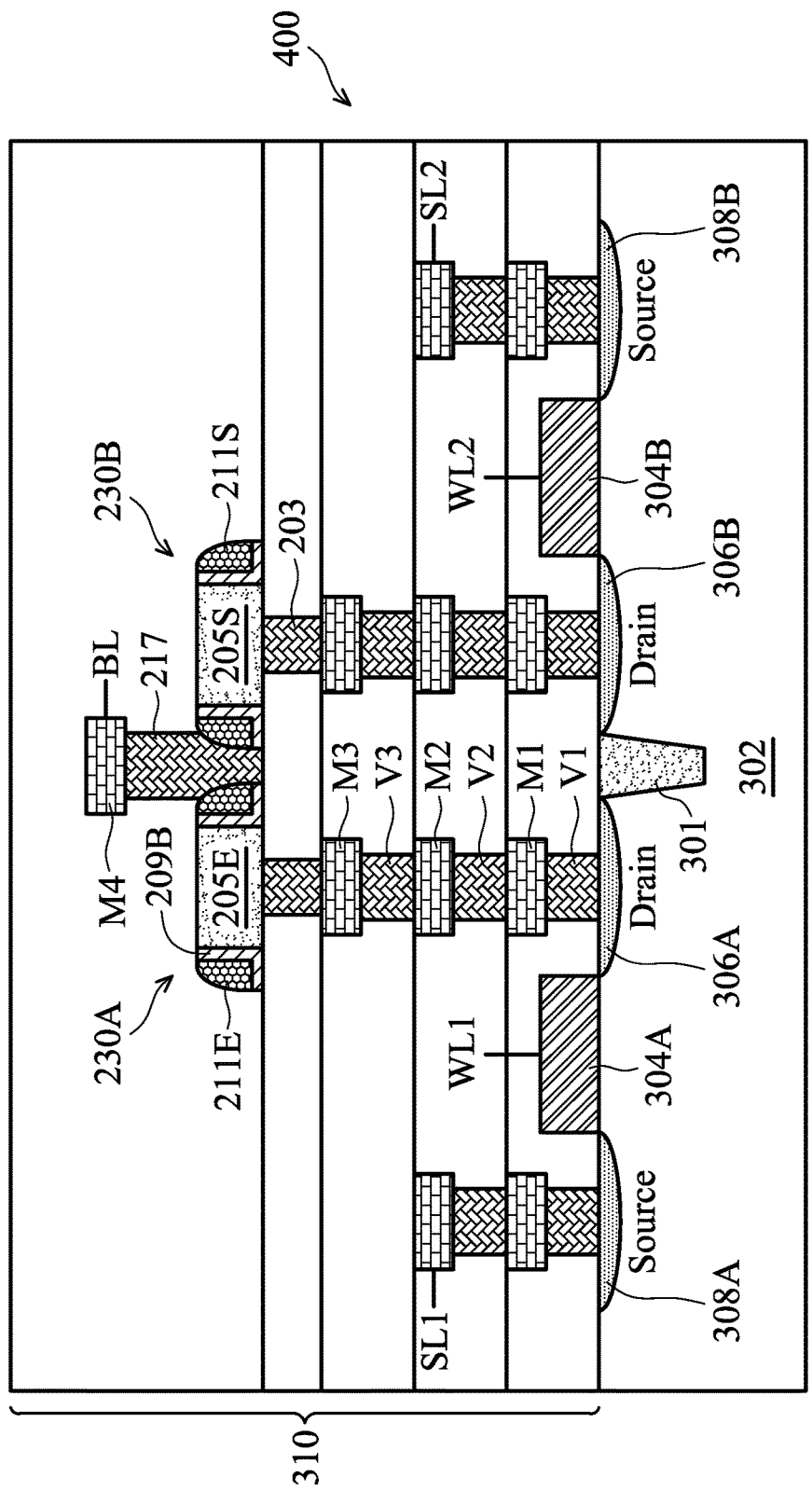
FIG. 4 is a cross-sectional view of a semiconductor structure having the resistance variable memory structure in FIG. 2D (or 2E) according to some embodiments of this disclosure.

FIG. 4 shows a semiconductor structure 400 substantially similar to the semiconductor structure 300 disclosed in FIG. 3. The description of the common structures are not repeated here although fully applicable in the following embodiments as well.

The semiconductor structure 400 having two resistance variable memory structures 230A and 230B substantially similar to the resistance variable memory structure 230 of FIG. 2D (or 2E). Second electrodes 211E and 211S of the resistance variable memory structures 230A and 230B contact (or share) a same columnar via 217. Through the columnar via 217, a bit line in metallization layer M4 is electrically coupled to the second electrode 211E of the resistance variable memory structure 230A and the second electrode 211S of the resistance variable memory structure 230B. Advantageously, the resistance variable memory structures 230A and 230B shared the same columnar via 217 provides extra space for functional integrated circuits and circuit routing.

The semiconductor structure 400 includes a first access transistor having a gate electrode 304A, a drain region 306A and a source region 308A on opposite sides of the gate electrode 304A. The semiconductor structure 400 also includes a second access transistor having a gate electrode 304B, a drain region 306B and a source region 308B on opposite sides of the gate electrode 304B. The first access transistor and the second access transistor are isolated by a shallow trench isolation (STI) structure formed by dielectric materials. Multiple dielectric layers 310 are formed over the access transistors and the substrate 302.

Referring still to FIG. 4, a plurality of stacked metallization layers (M1 to M4) and via layers (V1 to V3, 203 and 217) are formed over the access transistors and embedded in the dielectric layers 310. The plurality of stacked metal features and via layers provides interconnections between the access transistors, the resistance variable memory structures (230A and 230B), circuits and/or inputs/outputs.

During various operations of the resistance variable memory structure 230A, a source line SL1 in metallization layer M2 electrically coupled to the source region 308A of the first access transistor provides a source voltage. A bit line BL in metallization layer M4 electrically coupled to the drain region 306A of the first access transistor provides a drain voltage. A word line WL1 electrically coupled to the gate electrode 304A of the first access transistor is turned on with a gate voltage. The resistance variable memory structure 230A is able to perform previous mentioned "forming", "set" and "reset" operations for data storage. During various operations of the resistance variable memory structure 230A, the gate electrode 304B of the second access transistor is turned off and the source region 308B is floating.

Likewise, the resistance variable memory structure 230B is able to perform previous mentioned "forming", "set" and "reset" operations for data storage by applying specific voltages to the source region 308B (through a source line SL2 in metallization layer M2), the drain region 306B (through the same bit line BL in metallization layer M4) and the gate electrode 304B (through a word line WL2) of the second access transistor. During various operations of the resistance variable memory structure 230B, the gate electrode 304A of the first access transistor is turned off and the source region 308A is floating.

In some embodiments, the source line SL1 and the source line SL2 is a same source line. The resistance variable memory structures 230A and 230B share a same source line for the respective access transistors to provide extra space for functional integrated circuits and circuit routing. In certain embodiments, the source line SL1 and the source line SL2 have different source lines for circuit design concern.

In FIG. 4, the resistance variable memory structures (230A and 230B) and the shared columnar via 217 are formed overlying three metallization layers (M1 to M3). However, this disclosure is not limited to the above conditions for forming the resistance variable memory structures (230A and 230B) and the shared columnar via 217 above at least three metallization layers, and differing conditions that produce the above shared columnar via for at least two resistance variable memory structures are within the scope of this disclosure.

Various embodiments of the present disclosure may be used to improve the processes of a resistance variable memory structure. For example, the disclosed method 100 includes a single lithography patterning process in forming the first electrode 205E in operation 102. The second electrode 211E is formed by a spacer etching process without lithography patterning process in operation 104. The disclosed method 100 includes a single lithography patterning process (in operation 102) used to form both electrodes 205E and 211E. This disclosure eliminates drawbacks in other methods which use multiple lithography patterning process steps in patterning both the first and second electrodes. The manufacturing complexity and cost are reduced in accordance with some embodiments.

One aspect of the disclosure describes a method of forming a semiconductor structure. The method includes depositing a first electrode material over a conductive structure and a dielectric layer, patterning the first electrode material to form a first electrode contacting the conductive structure, depositing a resistance variable layer over the first electrode and the dielectric layer, depositing a second electrode material over the resistance variable layer, and etching a portion of the second electrode material and the resistance variable layer to form a second electrode over a remaining portion of the resistance variable layer.

A further aspect of the disclosure describes method of forming a semiconductor structure. The method comprising forming a transistor; forming a plurality of metallization layers over the transistor; and forming a resistance variable memory structure over the plurality of metallization layers. Forming the resistance variable memory structure comprises depositing a first electrode material over the plurality of metallization layers; patterning the first electrode material to form a first electrode; depositing a resistance variable layer over the first electrode; depositing a second electrode material over the resistance variable layer, and etching the second electrode material and the resistance variable layer to form a second electrode over a spacer of the resistance variable layer.

Another aspect of the disclosure describes a method of forming a memory structure. The method comprising forming at least one transistor; forming a plurality of metallization layers over the at least one transistor; forming at least one conductive structure over the plurality of metallization layers, the at least one conductive structure being embedded in a dielectric layer and electrically connected to the at least one transistor; forming at least one resistance variable memory structure over the at least one conductive structure and the dielectric layer; and forming a conductive plug contacting the second electrode or the resistance variable layer. Forming the at least one resistance variable memory structure comprises depositing a first electrode material over the at least one conductive structure and the dielectric layer; patterning the first electrode material to form a first electrode contacting the at least one conductive structure; depositing a resistance variable layer over the first electrode and a top surface of the dielectric layer; depositing a second electrode material over the resistance variable layer, and exposing a top surface of the first electrode and the top surface of the dielectric layer to form a second electrode over a remaining portion of the resistance variable layer.

Although the embodiments and its advantages have been described in detail, it should be understood that various changes, substitutions and alterations can be made herein without departing from the spirit and scope of the invention as defined by the appended claims. As one of ordinary skill in the art will readily appreciate from the present disclosure, processes, machines, manufacture, compositions of matter, means, methods, or steps that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed:

1. A method of forming a semiconductor structure comprising:
   depositing a first electrode material over a conductive structure and a top surface of a dielectric layer;
   patterning the first electrode material to form a first electrode contacting the conductive structure and over the top surface of the dielectric layer;
   depositing a resistance variable layer over the first electrode and the dielectric layer;
   depositing a second electrode material over the resistance variable layer, and
   etching a portion of the second electrode material and the resistance variable layer to form a second electrode over a remaining portion of the resistance variable layer: wherein the etching includes:
      removing the second electrode material and the resistance variable layer from a top surface of the first electrode to expose the top surface of the first electrode, and
      maintaining at least portions of each of the resistance variable layer and the second electrode material adjacent a sidewall of the first electrode, wherein each of the maintained portions of the resistance variable layer includes a vertical portion of the resistance variable layer abutting the sidewall of the first electrode and a horizontal portion of the resistance variable layer over a top surface of the dielectric layer and extending away from the first electrode along the top surface of the dielectric layer.

2. The method of claim 1, further comprising forming a cap layer on the resistance variable layer, the cap layer being between the resistance variable layer and the second electrode.

3. The method of claim 1, further comprising forming a conductive plug contacting the second electrode and the resistance variable layer.

4. The method of claim 3, wherein forming the conductive plug comprises:
   depositing an inter-level dielectric (ILD) layer over the second electrode and the resistance variable layer;
   etching a portion of the ILD layer to form an opening; and
   filling the opening with a conductive material to form the conductive plug.

5. The method of claim 1, further comprising forming the conductive structure embedded in the dielectric layer, the conductive structure being over at least three metallization layers, and electrically connected to the first electrode and the at least three metallization layers.

6. The method of claim 1, wherein patterning the first electrode material to form the first electrode comprises:
   covering a portion of the first electrode material by a mask layer;
   etching an uncovered portion of the first electrode material; and
   removing the mask layer.

7. The method of claim 1, wherein etching the portion of the second electrode material and the resistance variable layer comprises anisotropically etching the portion of the second electrode material and the resistance variable layer.

8. The method of claim 1, wherein
   the horizontal portion of the resistance variable layer directly interfacing the top surface of the dielectric layer.

9. A method of forming a semiconductor structure comprising:
   forming a transistor;
   forming a plurality of metallization layers over the transistor; and
   forming a resistance variable memory structure over the plurality of metallization layers, wherein forming the resistance variable memory structure comprises:
      depositing a first electrode material over the plurality of metallization layers;
      patterning the first electrode material to form a first electrode;
      depositing a resistance variable layer over the first electrode;
      depositing a second electrode material over the resistance variable layer; and
      etching the second electrode material and the resistance variable layer to form an L-shaped resistance variable layer having a vertical portion abutting a sidewall of the first electrode and a horizontal portion extending away from the first electrode and a second electrode over the resistance variable layer, wherein the second electrode has a top surface extending from a first end-point of the L-shaped resistance variable layer to a second end-point of the L-shaped resistance variable layer.

10. The method of claim 9, wherein depositing the resistance variable layer over the first electrode comprises depositing the resistance variable layer over a sidewall of the first electrode and a top surface of the first electrode.

11. The method of claim 10, wherein etching the second electrode material and the resistance variable layer comprises anisotropically etching the resistance variable layer and the second electrode material.

12. The method of claim 10, wherein etching the second electrode material and the resistance variable layer comprises etching the second electrode material and the resistance variable layer until a top surface of the first electrode is exposed.

13. The method of claim 9, wherein etching the second electrode material and the resistance variable layer to form the second electrode over the spacer of the resistance variable layer comprises forming: the vertical portion as a closed loop which surrounds the sidewall of the first electrode; and the horizontal portion which extends from the vertical portion away from the first electrode along a top surface of a dielectric layer.

14. The method of claim 9, further comprising depositing a dielectric layer over the plurality of metallization layers; wherein the depositing the first electrode material forms the first electrode material directly on a top surface of the dielectric layer.

15. The method of claim 14, further comprising forming a conductive structure embedded in the dielectric layer, the conductive structure being electrically connected to the plurality of metallization layers and the resistance variable memory structure.

16. The method of claim 9, further comprising forming a conductive plug contacting the second electrode or the resistance variable layer.

17. The method of claim 16, wherein forming the conductive plug comprises:
depositing an inter-level dielectric (ILD) layer over the second electrode and the resistance variable layer;
exposing the second electrode and the resistance variable layer by forming an opening in the ILD layer; and
depositing a conductive material in the opening.

18. A method of forming a memory structure comprising:
forming at least one transistor;
forming a plurality of metallization layers over the at least one transistor;
forming at least one conductive structure over the plurality of metallization layers, the at least one conductive structure being electrically connected to the at least one transistor and embedded in a dielectric layer;
forming at least one resistance variable memory structure over the at least one conductive structure and the dielectric layer, wherein forming the at least one resistance variable memory structure comprises:
depositing a first electrode material over the at least one conductive structure and the dielectric layer;
patterning the first electrode material to form a first electrode contacting the at least one conductive structure;
depositing a resistance variable layer over the first electrode and a top surface of the dielectric layer;
depositing a second electrode material over the resistance variable layer;
etching the second electrode material and the resistance variable layer to expose a top surface of the first electrode and expose the top surface of the dielectric layer and to form a second electrode over a remaining L-shaped portion of the resistance variable layer, wherein the remaining L-shaped portion of the resistance variable layer comprises:
a vertical portion abutting a sidewall of the first electrode; and
a horizontal portion extending from the vertical portion and extending over the top surface of the dielectric layer; and
forming a conductive plug contacting the second electrode or the resistance variable layer.

19. The method of claim 18, wherein patterning the first electrode material to form the first electrode comprises:
covering a portion of the first electrode material by a mask layer;
etching an uncovered portion of the first electrode material; and
exposing the portion of the first electrode material.

20. The method of claim 18, wherein the etching exposing the top surface of the first electrode and the top surface of the dielectric layer to comprises anisotropically etching.

* * * * *